United States Patent [19]

O'Neill

[11] Patent Number: 5,038,112
[45] Date of Patent: Aug. 6, 1991

[54] LEVELLING CONTROL CIRCUIT

[75] Inventor: Simon P. O'Neill, Bracknell, England

[73] Assignee: Technophone, Ltd., Camberley, England

[21] Appl. No.: 520,783

[22] Filed: May 8, 1990

[30] Foreign Application Priority Data

Jun. 20, 1989 [GB] United Kingdom ............. 8914142.8

[51] Int. Cl.$^5$ ............................................. H03G 7/20
[52] U.S. Cl. ................................ 330/207 P; 330/298; 455/117
[58] Field of Search .................... 307/540; 330/207 P, 330/298, 279, 129; 455/117

[56] References Cited

U.S. PATENT DOCUMENTS

| 3,449,680 | 6/1969 | Schilb et al. .............. 330/207 P X |
| 3,641,451 | 2/1972 | Hollingsworth et al. ... 330/207 P X |
| 4,122,400 | 10/1978 | Medendorp et al. ........... 330/207 P |
| 4,547,746 | 10/1985 | Erickson et al. ..................... 330/298 |
| 4,859,967 | 8/1989 | Swanson ....................... 455/117 X |

FOREIGN PATENT DOCUMENTS 2019142 10/1979 United Kingdom .

Primary Examiner—Steven Mottola
Attorney, Agent, or Firm—Perman & Green

[57] ABSTRACT

A levelling control arrangement for an RF transmitter circuit which additionally compensates for filter ripple, i.e. frequency dependant power variations caused by the filter disposed between a transmitter amplifier and an antenna. The forward and reflected power is sampled by a dual directional coupler between the amplifier and the filter. Signals $V_{fwd}$ and $V_{rev}$ are thus obtained indicative of the forward and reflected power levels respectively. The reflected signal $V_{rev}$ is subtracted from the forward signal $V_{fwd}$ at comparator and the difference signal $V_{diff}$ is compared with a reference signal Vref at comparator to produce a signal $V_c$ which is used to control the gain of the amplifier in such manner that the power developed by the amplifier increases as the signal $V_{rev}$ increases and vice versa. To protect against excessive reflected power levels a limiter may be included which causes the power developed by the amplifier to be reduced only if $V_{rev}$ exceeds a pre-set threshold.

18 Claims, 1 Drawing Sheet

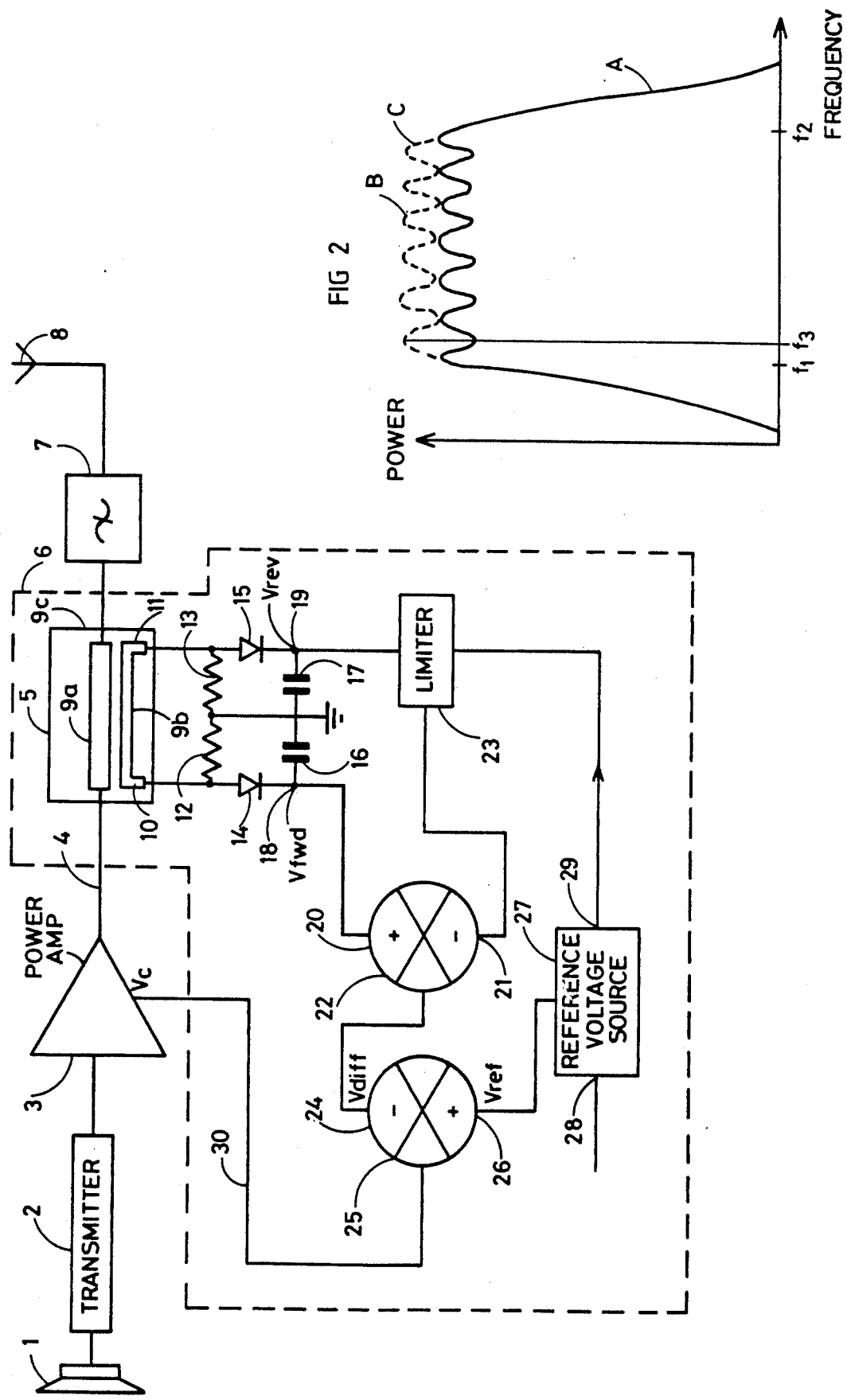

LEVELLING CONTROL CIRCUIT

BACKGROUND OF THE INVENTION

This invention relates to an amplifier circuit for controlling the magnitude of the output power of a radio frequency (RF) signal.

In order to transmit RF signals an RF transmitter amplifier is generally coupled to an antenna which radiates the signal so that it can be intercepted by appropriate receivers. The RF power developed by the transmitter amplifier and coupled to the antenna is commonly referred to as "forward power". However, since the transmitter amplifier and antenna are not electrically ideal elements, a proportion of the forward power will in practice be reflected back to the amplifier.

By incorporating a circuit which controls the magnitude of the output power the transmitter amplifier can be protected against excessive forward or reflected power which might otherwise destroy the amplifier. For example U.S. Pat. No. 3,449,680 provides protection by sensing the forward power to the final amplifier and reducing the current to a preceding stage if the final amplifier current increases. This takes no account of the reflected power. On the other hand, detection circuits have been used to sense increases in reflected power, for example when the transmitter amplifier sees an open circuit, e.g. because the antenna has been disconnected, broken off, or incorrectly assembled and to reduce the power of the transmitter amplifier accordingly. However, such circuits provide no protection against increases in forward power.

U.S. Pat. No. 3,641,451 discloses a circuit which protects against both forward and reflected power excesses. In that case a detector senses the forward power level and generates a first signal indicative thereof. This first signal is compared with a reference signal to provide a control signal which determines the power developed by the transmitter amplifier. Any increase in the forward power level is detected which changes the control signal to cause a reduction in the forward power developed by the transmitter amplifier. Conversely, any decrease in forward power level is detected and results in changing the control voltage to cause an increase in forward power developed by the transmitter amplifier. The reflected power is also sensed in such manner as to generate a second signal. When the reflected power is less than a predetermined threshold value no compensation is made to the power output. However, when the reflected power exceeds the threshold value this second signal causes a reduction in the magnitude of the reference signal, thus altering the control signal which consequently reduces the forward power of the transmitter amplifier to a safe level. Hence, above the threshold value, the forward power developed by the transmitter amplifier is decreased as the reflected power increases and vice versa, whereas below the threshold value the forward power is not modified to take account of the reflected power.

U.S. Pat. No. 3,641,451 employs a single threshold value for the reflected power at which the power reduction mechanism cuts in. However, the reflected power may in practice increase safely when the forward power is increased. No allowance is made for this in that U.S. patent, and therefore the gain of the transmitter amplifier may be reduced unnecessarily when the forward power is increased. With a view to overcoming this particular problem U.S. Pat. No. 4,122,400 proposes means for determining the ratio of the reflected power to the forward power and only when this ratio exceeds a given threshold is the gain of the amplifier reduced to protect it. The value of the reflected power at which the protection mechanism cuts in is variable depending on the magnitude of the forward power. This clearly permits a proportionally greater reflected power before the protection mechanism cuts in. Once again, above the threshold value, the forward power developed by the transmitter amplifier is decreased as the reflected power increases and vice versa, whereas below the threshold value the forward power is not modified to take account of the reflected power.

British patent application GB-A-2,019,142 and U.S. Pat. No. 4,547,746 both disclose transmitter circuits in which means are provided between the final filter and the antenna (i.e. after the filter) for sensing both the forward power and the reverse power. The two signals thus obtained are subtracted to provide a control signal for adjusting the output of the power amplifier.

It is noted that in the prior art, the power output of the final amplifier is generally reduced as the reflected power increases and vice versa.

The prior art circuits mentioned above tend to maintain the output power of the transmitter amplifier at a substantially uniform predetermined magnitude. Circuits which achieve this effect are commonly known as automatic levelling control or automatic output control circuits. Conventionally, transmitter amplifiers have only been required to operate at one power level. Such transmitter amplifiers are adjusted during manufacture to maintain the desired output power level. In some applications, it was desirable to have two power settings, specifically a high and a low level. The transmitter amplifier for such applications would have one setting for the high power level and another for the low power level.

Recently, with the advent of cellular radio telephones, it has become advantageous to re-use radio channels. Therefore, in order to avoid interference between two RF transmitter amplifiers using the same frequency, it is desirable to have a plurality of different selectable output power levels. Automatic output control circuits enabling an RF transmitter amplifier to maintain one of a plurality of output levels selected in response to control signals are disclosed in U.S. Pat. Nos. 4,523,155 and 4,602,218.

The transmitter amplifier of a radio is generally coupled to the antenna via a filter. It is an inherent feature of the filter that the transmitted power is, to a limited extent at least, frequency dependant. A plot of transmitted power versus frequency will show an oscillation or so-called "ripple" in the power level across the frequency band, as shown by plot A in FIG. 2 of the accompanying drawing. Thus, although in the prior art the power is levelled on the amplifier side of the filter, the power on the antenna side of the filter will vary depending on the frequency.

Ideally, the power on the antenna side of the filter should be substantially uniform irrespective of frequency, but the prior art documents discussed herein do not address this problem.

SUMMARY OF THE INVENTION

According to the present invention there is provided an amplifier circuit for controlling the magnitude of the output power of a radio frequency (RF) signal, comprising means having a variable output power for amplifying the RF signal, filtering means coupled to said amplifying means for transmitting signals within a predetermined frequency range, means coupled between the amplifying means and the filtering means for deriving a first signal indicative of the power reflected back from said filtering means towards said amplifying means, and means responsive to said first signal for applying a variable control signal to the amplifying means to adjust the output of said amplifying means by an amount related to the magnitude of said first signal.

The present invention recognizes that the power output on the antenna side of the filtering means is frequency dependant. Furthermore, the invention is based on the recognition that when the forward power transmitted by the filtering means is attenuated this is accompanied by a corresponding increase in the power reflected back from the filtering means to the amplifying means. The present invention compensates for this effect by increasing the forward power delivered to the filtering means to restore the power transmitted by the filtering means to the desired level. Hence an amplifier circuit in accordance with the invention has the advantage that it significantly reduces so called filter ripple. In other words, the forward power on the antenna side of the filtering means is substantially uniform and independent of frequency. To this end means are provided between the amplifying means and the filtering means for sensing the power reflected back towards the amplifying means from the filtering means and, in consequence, the forward power developed by the amplifying means is varied by an amount related to the magnitude of the reflected power.

In a preferred embodiment, and in marked contrast to the prior art, the means for applying the control signal to the amplifying means are adapted to increase the output power of said amplifying means in accordance with the amount by which said first signal exceeds a predetermined level. Thus, in essence, the forward power is increased when the power reflected back from the filtering means increases.

Suitably an amplifier circuit in accordance with the invention is arranged to maintain the magnitude of the output power from the filtering means at a substantially uniform predetermined level.

Preferably means are included in the circuit to protect the amplifying means, such that if the reflected power exceeds a threshold limit the means for applying the control signal responds causing the output power developed by the amplifying means to be reduced. The circuit in accordance with the invention thus operates to increase the forward power in response to increasing reflected power only below the threshold value and above the threshold value the circuit operates in conventional manner to protect the amplifying means.

In a preferred embodiment means are also provided for deriving a second signal indicative of the forward power delivered to the filtering means, in addition to means for generating a third signal indicative of the difference between the first and second signals, wherein the output power of said amplifying means is varied by the control signal so as to increase when the third signal decreases and to decrease when the third signal increases. Hence the output power is increased if the reflected power increases by more than the forward power and vice versa.

Suitably, there are also provided means for generating a reference signal, and means for generating a fourth signal indicative of the difference between the reference signal and the third signal, wherein the output power of said amplifying means is varied by the control signal so as to increase when the fourth signal increases and to decrease when the fourth signal decreases. Indeed the fourth signal may be applied directly to the amplifying means as the control signal.

In a multi-power level application the means for generating a reference signal may be adapted to generate selectively a reference signal having one of a plurality of predetermined levels. Consequently the output power of the amplifying means will be maintained constant at one of a plurality of different power levels. In the cellular telephone art, eight discrete levels may be used.

BRIEF DESCRIPTION OF THE DRAWINGS

An embodiment of the invention will now be described, by way of example, with reference to the accompanying drawing, in which:

FIG. 1 is a combined schematic and block diagram of a radio transmitter circuit in accordance with the present invention, and FIG. 2 is a graph showing the variation of output power with frequency for a filter in such a circuit.

DETAILED DESCRIPTION OF A PREFERRED EMBODIMENT

Referring to FIG. 1, audio signals received at microphone 1 are coupled to transmitter 2 where the audio frequency modulates a radio frequency (RF) carrier. The frequency modulated RF signals at the transmitter are coupled to an RF power amplifier 3 where they are amplified to the desired RF power level and coupled via conductor 4 to a dual directional coupler 5. The dual directional coupler 5 forms part of the levelling control and amplifier protection circuit (for protecting the RF power amplifier 3) to be discussed in greater detail below. From coupler 5 the RF signals are coupled via a conventional passband filter 7 to antenna 8 where the RF signals are radiated. It is noted here that in the case of a radio intended for two-way communications, the filter 7 may be a duplex filter coupled also to the receiver circuits (not shown) of the radio.

The RF power developed by the transmitter amplifier 3 and coupled to antenna 8 via filter 7 is referred to as "forward power". Since the transmitter amplifier 3 and the antenna 8 are not ideally matched across the whole range of pass band frequencies transmitted by the filter 7, part of the forward power is reflected back to the amplifier 3. Also, if the antenna 8 were broken or simply not connected, or not connected properly, some or all of the power from the amplifier 3 would be reflected back to the amplifier. The RF signal reflected back to the amplifier 3 is called "reflected power".

As discussed previously, levelling control circuits may be employed to maintain the forward power developed by the amplifier at a substantially uniform level. However, the known circuits do not take account of the effect caused by a filter in the circuit. Plot A in FIG. 2 shows how the power level varies across the pass band $f_1$-$f_2$ of a typical filter for this application. Specifically the power level oscillates over the entire frequency range. This effect is known as "ripple". Because of this ripple the power coupled to the antenna is not uniform (since it is frequency dependant) although the power coupled to the filter may indeed be substantially uniform.

The present invention seeks to overcome the problem of filter ripple so as to deliver a more uniform level of power to the antenna irrespective of frequency. The variation in attenuation of power caused by the filter can be attributed to two effects. Firstly, there is inherent loss in the filter itself, and secondly there is a variation in the amount of power reflected by the filter due to a variation in impedance thereof. The present invention seeks to overcome the second effect by measuring and compensating for the power reflected by the filter. To this end, the present invention involves the unfamiliar expedient of increasing the forward power developed by the transmitter amplifier 3 as the reflected power increases in order to compensate for attenuation at the filter. This is represented by plots B and C in FIG. 2. Plot B shows the variation of the forward power developed by the amplifier 3 relative to the attenuation caused by the filter. Hence, at a specific frequency $f_3$ when there is maximum power attenuation at the filter, the power developed by the amplifier 3 is also at a maximum level.

The result of superimposing plot B on plot A is the plot C which has a plateau region across the whole frequency range $f_1-f_2$. That is to say, the power level coupled to the antenna from the filter is uniform across the entire pass band spectrum and so the effect of filter ripple is substantially eliminated.

The plot C represents one particular predetermined power level corresponding substantially to the power level which the power amplifier 3 would have delivered to the antenna 8 in the absence of the filter 7. It is noted, however, that if a lower, but nevertheless uniform, predetermined power level could be tolerated then the output power of the amplifier 3 would still be increased when the reflected power falls below the (lower) predetermined level, but would be decreased when the reflected power exceeds this (lower) predetermined level. The plateau region C would then lie at a power level value lower than that shown in FIG. 2.

The manner in which filter ripple can be minimized in accordance with the invention will now be described with reference to FIG. 1.

Forward power developed at amplifier 3 and reflected power coupled back to amplifier 3 on conductor 4 are coupled through dual directional coupler 5 in the level control and protection circuit 6. The dual directional coupler 5 is of conventional type and may, for example, be a microstrip type coupler with the narrow conductors 9a and 9b parallel to each other and side coupled over a quarter wavelength at the carrier frequency. The conductors 9a and 9b are on the surface of dielectric substrate 9c with the opposite surface being covered by a sheet of conductive material (not shown). The main signal is coupled between the amplifier 3 and the filter 7 via conductor 9a with a portion of that signal coupled to conductor 9b. In accordance with well known properties of such directional couplers, a portion of the signal travelling from the power amplifier 3 to the filter 7 (forward power) appears at terminal 10 of conductor 9b with little or no signal at end 11 of conductor 9b. In a similar way, a portion of the signal travelling in the opposite direction from antenna 8 and filter 7 towards amplifier 3 (reflected power) is coupled to terminal 11 of conductor 9b with little or no signal at end 10 of conductor 9b. The coupler 5, therefore, senses forward and reflected power with a sample of forward power appearing at terminal 10 of conductor 9b and a sample of reflected power appearing at terminal 11 of conductor 9b. The end 10 of conductor 9b is terminated by resistance 12 and the end 11 is terminated in a resistance 13. The resistances 12 and 13 are each approximately equal to the characteristic impedance of the coupled line. A forward power detector is provided including diode 14 and capacitor 16 with the anode of diode 14 coupled to terminal 10 of the coupler 5 and the cathode coupled at point 18 to one terminal of capacitor 16. The other terminal of capacitor 16 is coupled to ground or reference potential. The diode 14 is for example a Schottky barrier type diode. Similarly, reflected power is detected via the detector provided by the diode 15 and capacitor 17 with the anode of diode 17 coupled to terminal 11 of conductive strip 9b and the cathode connected at point 19 to one terminal end of capacitor 17. The opposite terminal end of capacitor 17 is coupled to ground or reference potential. The diode 17 is also a Schottky barrier type diode. Voltages $V_{fwd}$ and $V_{rev}$ are therefore derived at points 18 and 19 which are proportional to the positive RF peaks of the respective forward and reflected power.

Terminal 18 is connected to the positive terminal 20 of a comparator 22 and terminal 19 is connected to the negative input 21 of the comparator 22 via a limiter 23. Below a threshold value of the signal appearing on terminal 19 ($V_{rev}$) the limiter 23 has no effect, as will be discussed in more detail below. The comparator operates to subtract the signal from terminal 19, i.e. $V_{rev}$ indicative of the reflected power, from the signal at terminal 18, i..e. $V_{fwd}$ indicative of the forward power, and the resultant difference signal, $V_{diff}$, is applied to terminal 24 of comparator 25. A reference voltage $V_{ref}$ from a reference voltage source 27 is applied to terminal 26 of comparator 25. The comparator 25 generates a control voltage $V_c$ on conductor 30 depending on the comparison of the difference signal $V_{diff}$ with the reference voltage $V_{ref}$, which is applied to the transmitter amplifier 3 to control the gain thereof in known manner. Conventional means (not shown) for ensuring stable operation may be included in the circuit between the comparator 25 and the amplifier 3. The gain of the amplifier 3, and hence the power developed, is increased in accordance with an increase in the reflected power sensed by the circuit arrangement. Consequently, the power level on the antenna side of the filter can be maintained at a substantially uniform predetermined level as discussed with reference to FIG. 2 above.

It is noted here that the circuit may be adapted to operate at one of a plurality of different power levels. To this end it is possible to vary the reference voltage generated by the reference voltage source 29 by altering the signal applied to input 28 thereof. For example, the reference voltage source 29 may be able to provide a plurality of different reference voltages depending on the signal applied to inputs 28. This makes it possible for the power amplifier to operate at a corresponding number of different preselected power levels. For example, eight discrete power levels may be used in a cellular radio telephone application.

The circuit as disclosed continuously compensates for excess forward power. Furthermore, the present circuit embodiment additionally incorporates means for protecting the amplifier against excessive reflected power levels. To this end a limiting device 23 is included in the circuit between terminal 19 of the reflected power sampling arrangement and terminal 21 of comparator 22. The limiting device 23 is coupled to the voltage reference source 27 and is operative to modify the level of the reference voltage $V_{ref}$ generated when the level of the reflected power, and hence the value of the signal $V_{rev}$ indicative thereof, exceeds a pre-set threshold value. This modification of the reference voltage causes a consequential variation of the control voltage $V_c$ applied to amplifier 3, which reduces the gain and so reduces the power developed by the amplifier to a safe level, hence protecting the amplifier 3 against damage or destruction. A limiting device operable in this manner is disclosed in the aforementioned U.S. Pat. No. 3,641,451. Below the threshold value the limiter has no effect and so the circuit operates in the manner already described. In the present embodiment the limiter 23 is also present in a negative feedback circuit across the comparators. In the multi-power level mode envisaged above, the limiter would be scaled with reference to the variable voltage source 27 to function at different threshold values at the respective operating power levels.

It is noted here that the amount of increase which is needed in power to compensate for the attenuation at the filter is not exactly equal to, but will usually be greater than, the magnitude of the signal reflected back from the filter since a proportion of the increased power will itself be reflected back from the filter to the amplifier. This can readily be accommodated in the circuit design by the choice of suitable values for the components in the circuit arrangements for sensing the forward and reflected power respectively, or otherwise scaling the signals derived therefrom appropriately; measures which are readily within the skills of an ordinary practitioner in the art.

In view of the foregoing description of one specific embodiment, it will be evident to a person skilled in the art that various modifications may be made within the scope of the invention defined in the following claims. For example, if the reflected power coefficient can be guaranteed to be low, e.g. less than say 3dB, the limiter can be dispensed with altogether. Furthermore, although the described embodiment has featured a specific hardware implementation, it will be understood by a practioner of ordinary skill in the art that it would be equally possible to realise a software implementation within the scope of the invention.

I claim:

1. An amplifier circuit for controlling the magnitude of the output power of a radio frequency (RF) signal, comprising
    means having a variable output power for amplifying the RF signal,
    filtering means coupled between said amplifying means and a transmitting antenna, for transmitting signals within a predetermined frequency range to said antenna,
    means coupled between the amplifying means and the filtering means for deriving a first signal indicative of the power reflected back from said filtering means towards said amplifying means, and
    means responsive to said first signal for applying a variable control signal to the amplifying means to adjust the output of said amplifying means by an amount related to the magnitude of said first signal.

2. An amplifier circuit as claimed in claim 1, wherein the means for applying a control signal are adapted to vary the control signal such that the output of said amplifying means is increased in accordance with the amount by which said first signal exceeds a predetermined level.

3. An amplifier circuit as claimed in claim 2, comprising means for deriving a second signal indicative of forward power delivered to the filtering means, and means for generating a third signal indicative of the difference between the first and second signals, wherein the control signal is varied to increase the output power of said amplifying means by an amount related to the third signal.

4. An amplifier circuit as claimed in claim 3, comprising means for generating a reference signal, and means for generating a fourth signal indicative of the difference between the reference signal and the third signal, wherein the control signal is varied to increase the output power of said amplifying means by an amount related to the fourth signal.

5. An amplifier circuit as claimed in claim 4, wherein the control signal applied to the amplifying means is the fourth signal.

6. An amplifier circuit as claimed in claim 4 or claim 5, wherein the means for generating a reference signal is adapted to generate selectively a reference signal having one of a plurality of predetermined levels.

7. An amplifier circuit as claimed in claim 3, wherein the means for deriving the first signal and the means for deriving the second signal comprise common power sampling means.

8. An amplifier circuit as claimed in claim 7, wherein the common power sampling means comprises a dual directional coupler.

9. An amplifier circuit as claimed in claim 2, adapted to maintain the magnitude of the output power from the filtering means at a substantially uniform predetermined level.

10. An amplifier circuit for controlling the magnitude of the output power of a radio frequency (RF) signal, comprising
    means having a variable output power for amplifying the RF signal,
    filtering means coupled to said amplifying means for transmitting signals within a predetermined frequency range,
    means coupled between the amplifying means and the filtering means for deriving a first signal indicative of the power reflected back from said filtering means towards said amplifying means,
    means responsive to said first signal for applying a control signal to the amplifying means such that when the first signal is below a threshold level, the output of said amplifying means is varied by an amount related to the magnitude of the first signal, and
    means for sensing when the first signal exceeds the threshold level, wherein the means for applying the control signal is responsive to said sensing means when the first signal exceeds said threshold level to reduce the output power of said amplifying means.

11. An amplifier circuit as claimed in claim 10, wherein the means for applying a control signal are adapted to vary the control signal such that the output of said amplifying means is increased in accordance with the amount by which said first signal exceeds a predetermined level.

12. An amplifier circuit as claimed in claim 11, comprising means for deriving a second signal indicative of forward power delivered to the filtering means, and means for generating a third signal indicative of the difference between the first and second signals, wherein the control signal is varied to increase the output power of said amplifying means by an amount related to the third signal.

13. An amplifier circuit as claimed in claim 12, comprising means for generating a reference signal, and means for generating a fourth signal indicative of the difference between the reference signal and the third signal, wherein the control signal is varied to increase the output power of said amplifying means by an amount related to the fourth signal.

14. An amplifier circuit as claimed in claim 13, wherein the control signal applied to the amplifying means is the fourth signal.

15. An amplifier circuit as claimed in claim 13 or claim 14, wherein the means for generating a reference signal is adapted to generate selectively a reference signal having one of a plurality of predetermined levels.

16. An amplifier circuit as claimed in claim 11, wherein the means for deriving the first signal and the means for deriving the second signal comprise common power sampling means.

17. An amplifier circuit as claimed in claim 16, wherein the common power sampling means comprises a dual directional coupler.

18. An amplifier circuit as claimed in claim 11, adapted to maintain the magnitude of the output power from the filtering means at a substantially uniform predetermined level.

* * * * *